US011897077B2

(12) United States Patent
Miki (10) Patent No.: US 11,897,077 B2
(45) Date of Patent: Feb. 13, 2024

(54) SEMICONDUCTOR MANUFACTURING APPARATUS

(71) Applicant: Kioxia Corporation, Tokyo (JP)

(72) Inventor: Tsutomu Miki, Yokkaichi Mie (JP)

(73) Assignee: KIOXIA CORPORATION, Tokyo (JP)

( * ) Notice: Subject to any disclaimer, the term of this patent is extended or adjusted under 35 U.S.C. 154(b) by 271 days.

(21) Appl. No.: 17/183,947

(22) Filed: Feb. 24, 2021

(65) Prior Publication Data

US 2021/0283743 A1 Sep. 16, 2021

(30) Foreign Application Priority Data

Mar. 10, 2020 (JP) ................... 2020-040681

(51) Int. Cl.
*B24B 37/005* (2012.01)
*H01L 21/02* (2006.01)
*H01L 21/3105* (2006.01)
*H01L 21/66* (2006.01)

(52) U.S. Cl.
CPC ...... *B24B 37/005* (2013.01); *H01L 21/02074* (2013.01); *H01L 21/31055* (2013.01); *H01L 22/26* (2013.01)

(58) Field of Classification Search
CPC ... B24B 37/005; B24B 37/042; B24B 49/003; B24B 49/04; B24B 49/045; H01L 21/02074; H01L 21/31055; H01L 22/26
USPC .......................................... 451/5, 10, 11, 41
See application file for complete search history.

(56) References Cited

U.S. PATENT DOCUMENTS

| 6,051,500 | A | 4/2000 | Maury et al. |
| 6,730,603 | B2 | 5/2004 | Crevasse et al. |
| 6,949,007 | B1 * | 9/2005 | Wang ..................... B24B 37/013 438/645 |
| 10,553,507 | B2 | 2/2020 | Ono et al. |
| 2006/0043071 | A1 * | 3/2006 | Lee .......................... H01L 22/12 216/88 |
| 2012/0058709 | A1 * | 3/2012 | Fukushima ............. B24B 37/10 451/364 |
| 2017/0263512 | A1 * | 9/2017 | Ono .................. H01L 21/67092 |
| 2019/0143474 | A1 | 5/2019 | Wang et al. |
| 2019/0148191 | A1 * | 5/2019 | Wang ..................... B24B 49/10 438/10 |

FOREIGN PATENT DOCUMENTS

| JP | 3894367 | B2 | 3/2007 |
| JP | 4326985 | B2 | 9/2009 |
| JP | 5301931 | B2 | 9/2013 |
| JP | 2017-163100 | A | 9/2017 |
| JP | 6437608 | B1 * | 12/2018 | ........... B24B 37/013 |

* cited by examiner

*Primary Examiner* — Don M Anderson
*Assistant Examiner* — Caleb Andrew Holizna
(74) *Attorney, Agent, or Firm* — Foley & Lardner LLP (57) ABSTRACT

A semiconductor manufacturing apparatus includes a first top ring that is rotatable and configured to hold a wafer, a first turntable that is rotatable and has a polishing pad for performing polishing of a film formed on the wafer, a sound measuring unit (sensor) that measures a first sound generated during the polishing, and a first calculation unit (controller) that calculates a polishing amount of the film based on a first sound pressure of the first sound, a polishing amount per unit time of the polishing, and a time of the polishing.

18 Claims, 8 Drawing Sheets

(*1) SOUND PRESSURE DIFFERENCE = $\int_{f_1}^{f_2}$ (SOUND PRESSURE DURING POLISHING − SOUND PRESSURE BEFORE POLISHING)

(*2) POLISHING AMOUNT PREDICTION VALUE = $\sum_{t=1}^{n} \left( \int_{f_1}^{f_2} \right.$ ((SOUND PRESSURE DURING POLISHING − SOUND PRESSURE BEFORE POLISHING) × POLISHING AMOUNT PER UNIT TIME)

CREATE SOUND PRESSURE Avg PREDICTION MODEL
(EXPONENTIAL REGRESSION MODEL) DURING POLISHING FROM THE NUMBER OF
CUMULATED PROCESSED WAFERS AND SOUND PRESSURE ACTUAL VALUE (Avg)

$S = a \times \exp(b\mu)$
S: SOUND PRESSURE Avg PREDICTION VALUE
$\mu$: THE NUMBER OF CUMULATED PROCESSED WAFERS
a, b: COEFFICIENT SET CORRECTION COEFFICIENT = 1 WHEN REPLACING PAD
(WHEN RESETTING THE NUMBER OF CUMULATED PROCESSED WAFERS) AND CONVERT
SOUND PRESSURE Avg PREDICTION VALUE TO CORRECTION COEFFICIENT $W = c \times \exp(dS)$
W: CORRECTION COEFFICIENT
S: SOUND PRESSURE Avg PREDICTION VALUE
c, d: COEFFICIENT

SEMICONDUCTOR MANUFACTURING APPARATUS

CROSS-REFERENCE TO RELATED APPLICATIONS

This application is based upon and claims the benefit of priority from Japanese Patent Application No. 2020-040681, filed Mar. 10, 2020, the entire contents of which are incorporated herein by reference.

FIELD

Embodiments described herein relate generally to a semiconductor manufacturing apparatus.

BACKGROUND

When polishing a surface of a wafer, a polishing amount is measured by a predetermined method. In a semiconductor manufacturing process, the accuracy required for controlling the thickness of a film by polishing is becoming higher and higher.

DETAILED DESCRIPTION

An object of at least one embodiment is to provide a semiconductor manufacturing apparatus capable of calculating a polishing amount with high accuracy.

The semiconductor manufacturing apparatus of at least one embodiment includes a first top ring that is rotatable and is configured to hold a wafer, a first turntable that is rotatable and has a polishing pad for performing polishing of a film formed on the wafer, a sound measuring unit (sound sensor) that measures a first sound generated during the polishing, and a first calculation unit (controller) that calculates a polishing amount of the film based on a first sound pressure of the first sound, a polishing amount per unit time of the polishing, and a time of the polishing.

Hereinafter, embodiments will be described with reference to the drawings. In the drawings, the same or similar parts are designated by the same or similar reference numerals.

First Embodiment

Figure 1:
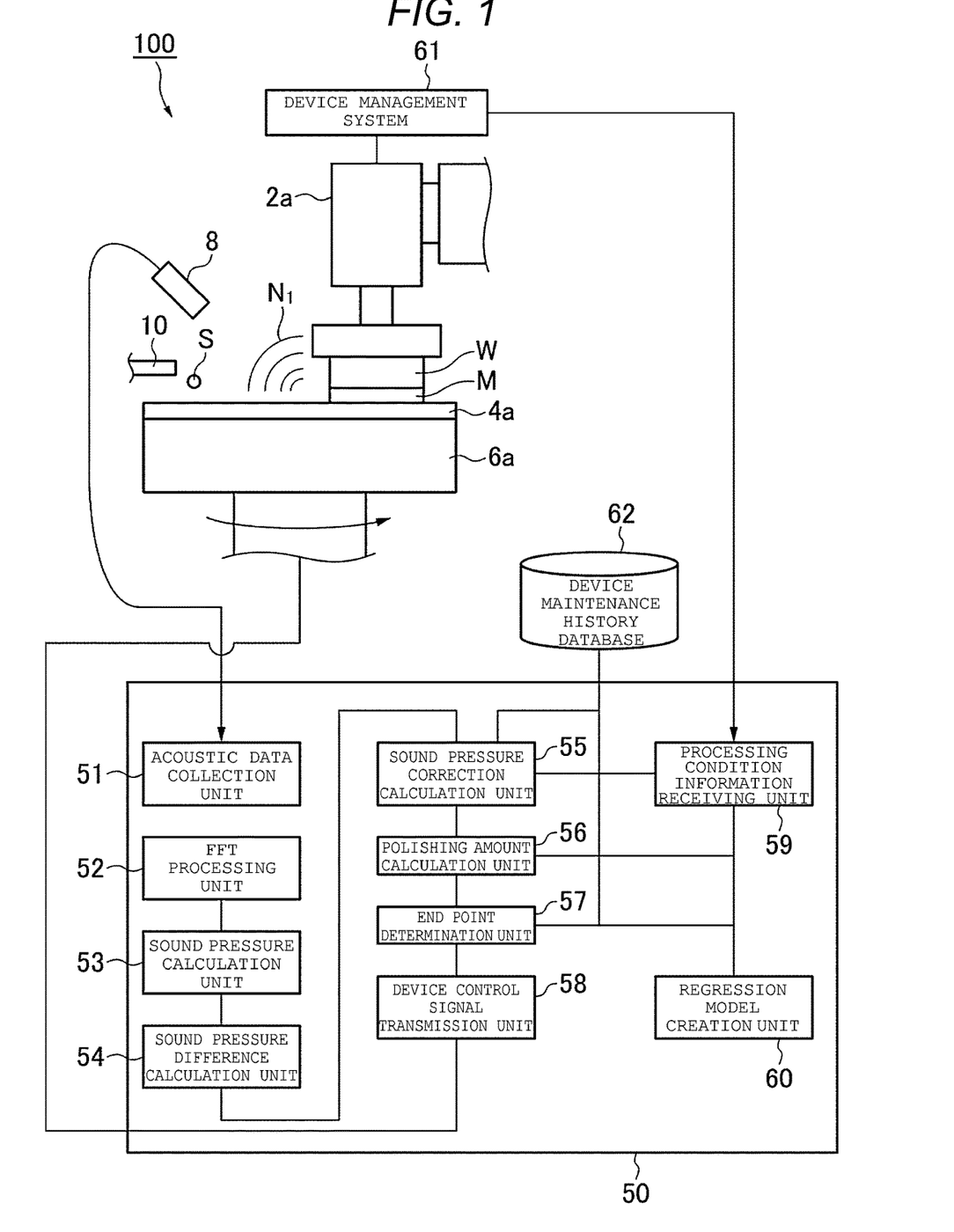
FIG. 1 is a schematic view of main portions of a semiconductor manufacturing apparatus of a first embodiment.

FIG. 1 is a schematic view of main portions of a semiconductor manufacturing apparatus 100 of at least one embodiment.

The semiconductor manufacturing apparatus 100 includes a first top ring 2a, a first polishing pad 4a, a first turntable 6a, a sound measuring unit 8, a slurry supply nozzle 10, a control device 50 (an example of a control unit (controller), and which may be a processor), a device management system 61, and a device maintenance history database 62.

The control device 50 includes an acoustic data collection unit 51, an FFT processing unit 52, a sound pressure calculation unit 53 (an example of a second calculation unit), a sound pressure difference calculation unit 54, a sound pressure correction calculation unit 55, a polishing amount calculation unit 56 (an example of a first calculation unit), an end point determination unit 57, a device control signal transmission unit 58, a processing condition information receiving unit 59, and a regression model creation unit 60 (an example of a third calculation unit).

The semiconductor manufacturing apparatus of at least one embodiment is, for example, an apparatus including a chemical mechanical polishing (CMP) apparatus for chemically and mechanically polishing a wafer W and including a system for controlling such a CMP apparatus. Further, in the semiconductor manufacturing apparatus of at least one embodiment, a plurality of CMP apparatuses may be disposed.

The wafer W is, for example, a semiconductor substrate. A film M is formed on a surface of the wafer W.

The first turntable 6a can be rotated, for example, in a horizontal plane by a commercially available motor or the like built in the first turntable 6a.

The first polishing pad 4a is provided on the first turntable 6a. The first polishing pad 4a is used for polishing the film M. The first polishing pad 4a is, for example, a pad made of polyurethane. However, a material of the first polishing pad 4a is not limited to polyurethane.

The first top ring 2a is provided on the first polishing pad 4a, and holds the wafer W on a lower surface, for example. The first top ring 2a can be rotated, for example, in a horizontal plane by a commercially available motor or the like built in the first top ring 2a. Therefore, the first top ring 2a can rotate the wafer W, for example, in a horizontal plane.

The sound measuring unit 8 is disposed in the vicinity of, for example, a processing point where the first polishing pad 4a and the wafer W are in contact with each other. The sound measuring unit 8 measures a sound before the start of polishing and a sound generated during the polishing. The sound measuring unit 8 is, for example, a microphone. It is desirable that the sound measuring unit 8 (sound sensor) can measure a sound in a frequency bandwidth of 10 Hz or higher and less than 20 kHz (an example of a tenth sound) and a sound in a frequency bandwidth of 20 kHz or higher and 50 kHz or lower (an example of an eighth sound). Further, it is desirable that the sound measuring unit 8 can measure a sound in a frequency bandwidth of 10 Hz or higher and less than 20 kHz and a sound in a frequency bandwidth of 20 kHz or higher and 70 kHz or lower (an example of a seventh sound). Further, it is desirable that the sound measuring unit 8 can measure a sound in a frequency bandwidth of 10 Hz or higher and less than 20 kHz and a sound in a frequency bandwidth of 20 kHz or higher and 100 kHz or lower (an example of a sixth sound and ninth sound). For example, the sound in the frequency bandwidth of 10 Hz or higher and less than 20 kHz is a sound in an audible range. Further, for example, the sound in the frequency bandwidth of 20 kHz or higher and 100 kHz or lower is a sound in an ultrasonic bandwidth.

The slurry supply nozzle 10 is provided on the first polishing pad 4a. The slurry supply nozzle 10 supplies slurry S used for CMP to the first polishing pad 4a.

The control device 50, the acoustic data collection unit 51, the FFT processing unit 52, the sound pressure calculation unit 53, the sound pressure difference calculation unit 54, the sound pressure correction calculation unit 55, the polishing amount calculation unit 56, the end point determination unit 57, the device control signal transmission unit 58, the processing condition information receiving unit 59, the regression model creation unit 60, and the device management system 61 are, for example, electronic circuits. The control device 50, the acoustic data collection unit 51, the FFT processing unit 52, the sound pressure calculation unit 53, the sound pressure difference calculation unit 54, the sound pressure correction calculation unit 55, the polishing amount calculation unit 56, the end point determination unit 57, the device control signal transmission unit 58, the processing condition information receiving unit 59, the regression model creation unit 60, and the device management system 61 are, for example, a computer configured with a combination of hardware such as an arithmetic circuit and software such as a program.

The device maintenance history database 62 (an example of a first storage unit, a second storage unit, and a third storage unit) is, for example, a storage device. The storage device is, for example, a semiconductor memory or a hard disk. The device maintenance history database 62 may include one storage device or may include a plurality of storage devices.

Figure 2:
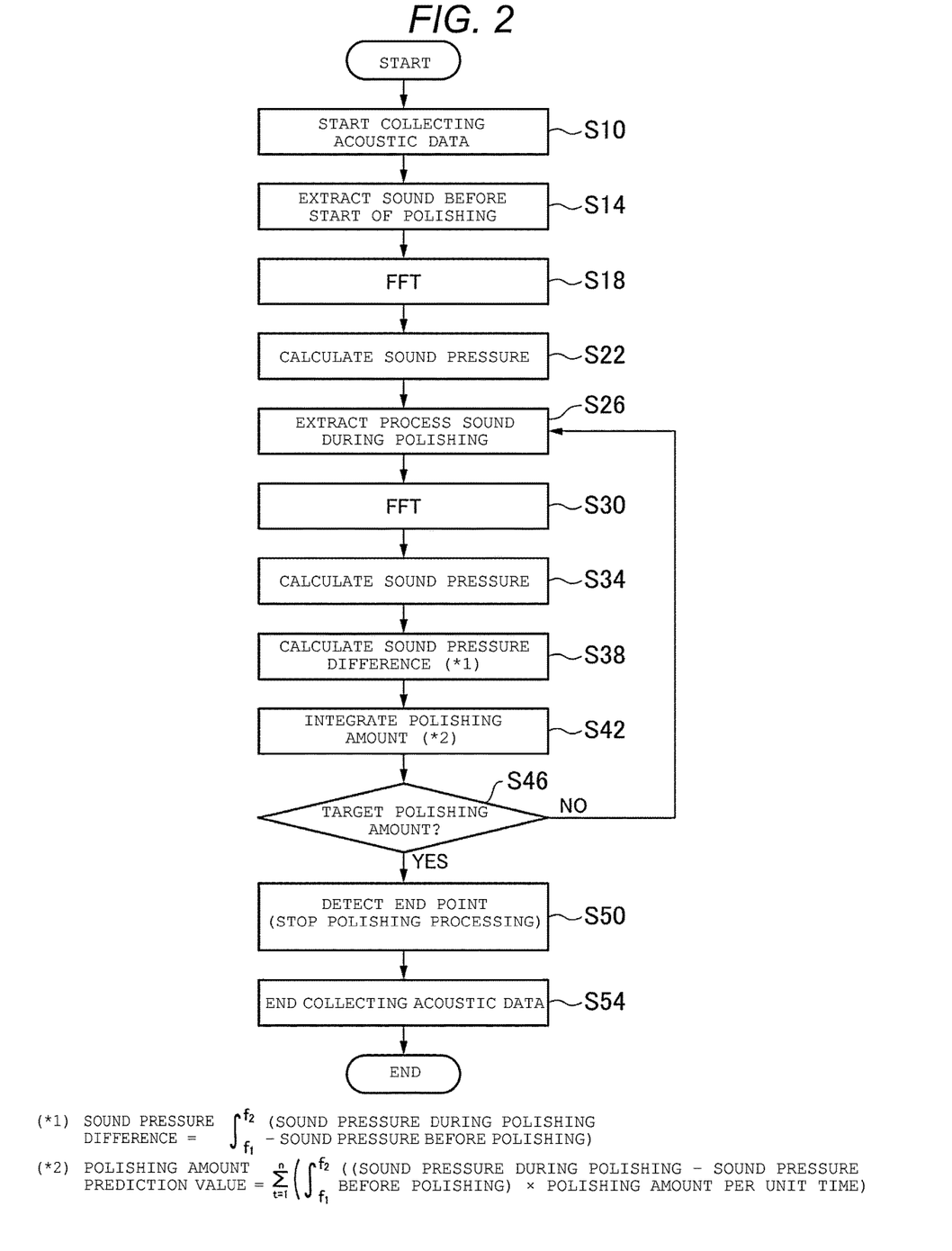
FIG. 2 is a flowchart of a method for manufacturing a semiconductor using the semiconductor manufacturing apparatus of the first embodiment.

FIG. 2 is a flowchart of a method for manufacturing a semiconductor performed by the semiconductor manufacturing apparatus 100 of the present embodiment.

First, the slurry S is supplied from the slurry supply nozzle 10 to the first polishing pad 4a provided on the first turntable 6a. The first turntable 6a is rotated. The first top ring 2 that holds the wafer W is rotated. Next, the sound measuring unit 8 starts collecting acoustic data (S10), and measures sound (an example of a second sound) generated before the start of polishing for a predetermined time (S14). The sound before the start of polishing measured by the sound measuring unit 8 is collected by, for example, the acoustic data collection unit 51. The sound before the start of polishing includes a sound generated from the first top ring 2a (an example of a third sound), a sound generated from the first turntable 6a (an example of a fourth sound), and a sound of supplying the slurry S from the slurry supply nozzle 10.

Next, the sound before the start of polishing that is collected by the acoustic data collection unit 51 is transmitted to the FFT processing unit 52. The FFT processing unit 52 performs frequency analysis of the sound before the start of polishing by using a Fourier transform such as a fast Fourier transform (FFT), for example. Next, the sound pressure calculation unit 53 calculates the sound pressure data for each frequency of the sound before the start of polishing by using the result of the frequency analysis obtained by the FFT processing unit 52 (S22). The "sound pressure" is the magnitude or level (sound pressure level) of the component for each frequency.

Next, as the first turntable 6a and the first polishing pad 4a approach, the wafer W and the first polishing pad 4a are in contact with each other. As a result, the polishing of the film M formed on the surface of the wafer W is started.

Next, the sound measuring unit 8 measures the sound generated during the polishing for a predetermined time (S26). The sound generated during the polishing, which is measured by the sound measuring unit 8, is collected by the acoustic data collection unit 51.

Next, the sound generated during the polishing that is collected by the acoustic data collection unit 51 is transmitted to the FFT processing unit 52. The FFT processing unit 52 performs the frequency analysis of the sound generated during the polishing by using the Fourier transform (S30). Next, the sound pressure calculation unit calculates the sound pressure data for each frequency of the sound generated during the polishing by using the result of the frequency analysis obtained by the FFT processing unit 52 (S34).

Next, the sound pressure difference calculation unit 54 calculates a difference (sound pressure difference) between sound pressure (an example of a second sound pressure) data for each frequency of the sound before the start of polishing and sound pressure (an example of a fifth sound pressure) data for each frequency of the sound generated during the polishing (S38). The difference in the sound pressure data can be calculated by, for example, the following expression.

Sound pressure difference $$= \int_{f_1}^{f_2} (\text{Sound pressure during polishing} - \text{Sound pressure before polishing}) \quad (1)$$

That is, a sound pressure difference can be calculated by integrating the difference between the sound pressure data of the sound generated during the polishing (sound pressure during the polishing) and the sound pressure data of the sound before the start of polishing (sound pressure before polishing), with a range of the frequency $f_1$ to the frequency $f_2$.

As the difference (sound pressure difference) of the sound pressure (an example of a fifth sound pressure) data for each frequency, for example, a difference between the sound pressure generated by polishing with the slurry S and the sound pressure generated by polishing with water instead of the slurry S, may be used.

Figure 3:
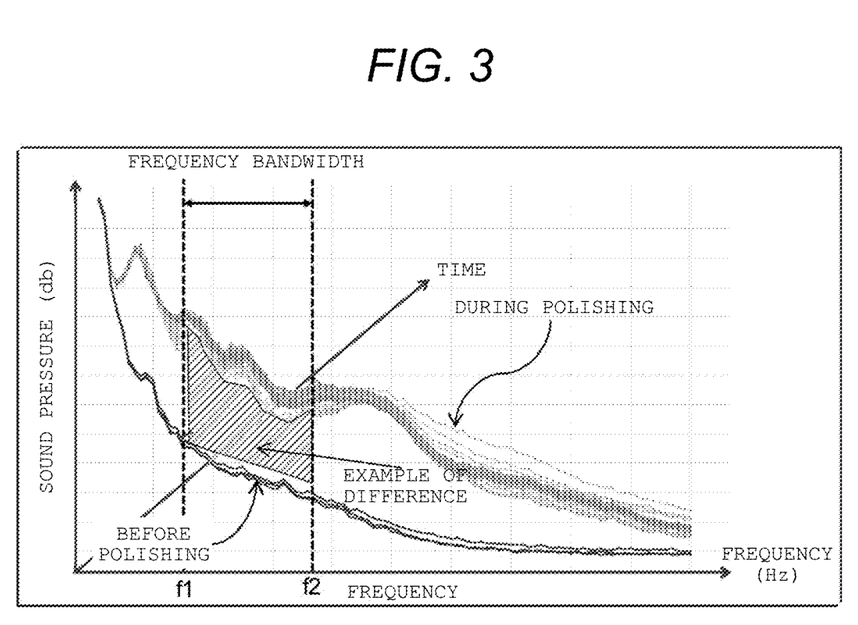
FIG. 3 is a view showing an example of a difference (difference in sound pressure) between sound pressure data for each frequency of a sound before the start of polishing and sound pressure data for each frequency of a sound generated during polishing.

FIG. 3 is a view showing an example of a difference (difference in sound pressure) between the sound pressure data for each frequency of the sound before the start of polishing and the sound pressure data for each frequency of the sound generated during the polishing. The sound pressure generated during the polishing is higher than the sound pressure before the start of polishing. This difference may be caused by the polishing of the film M. Therefore, the sound pressure difference can be obtained by integrating the difference in the range of the predetermined frequency $f_1$ to the frequency $f_2$.

Next, the polishing amount calculation unit 56 calculates a polishing amount by integrating the product of the difference in the sound pressure data for each frequency calculated by the sound pressure difference calculation unit 54 and the polishing amount per unit time (unit polishing amount) by the time of the polishing (time required for the polishing) t (S42). That is, the polishing amount (a prediction value of the polishing amount calculated by the sound pressure) can be calculated by, for example, the following expression.

$$\text{Prediction value of polishing amount} = \sum_{t=1}^{n} \left( \int_{f1}^{f2} (\text{Sound pressure during polishing} - \text{Sound pressure before polishing}) \times \text{Polishing amount per unit time} \right) \quad (2)$$

Where, the polishing amount per unit time is different for every material to be polished. For example, the unit polishing amount is different depending on whether a metal film is polished, an insulating film is polished, a specific stacked film is polished, or the like. Therefore, the polishing amount per unit time is obtained in advance for every material to be polished and stored in the device maintenance history database 62. Thereafter, the polishing amount calculation unit 56 reads the unit polishing amount, which differs depending on each material to be polished, from the device maintenance history database 62, and uses the read unit polishing amount for calculating the polishing amount.

The above-mentioned series of processes from (S26) to (S42) are repeated, for example, every unit time to calculate the polishing amount.

Next, the end point determination unit 57 compares the polishing amount calculated by the polishing amount calculation unit 56 with a target polishing amount and determines whether or not the polishing amount has reached the target polishing amount (S46). The target polishing amount is different for every material to be polished. Therefore, the target polishing amount is stored in advance for every material to be polished in the device maintenance history database 62. Thereafter, the endpoint determination unit 57 reads the target polishing amount, which differs depending on each material to be polished, from the device maintenance history database 62, and uses the read target polishing amount for determining whether or not the polishing amount has reached the target polishing amount.

When the polishing amount reaches the target polishing amount, for example, the control device 50 stops the polishing processing (S50). Thereafter, the acoustic data collection is ended (S54). On the other hand, when the polishing amount does not reach the target polishing amount, the sound measuring unit 8 further measures the sound generated during the polishing for the predetermined time (S26). In this way, the control device 50 controls polishing based on the polishing amount and the target polishing amount.

The above-mentioned operation is controlled by, for example, the device control signal transmission unit 58 of the control device 50 or an operator. Further, information on the material to be polished is transmitted from, for example, the device management system 61 to the processing condition information receiving unit 59, and is appropriately used in the control device 50.

Figure 4:
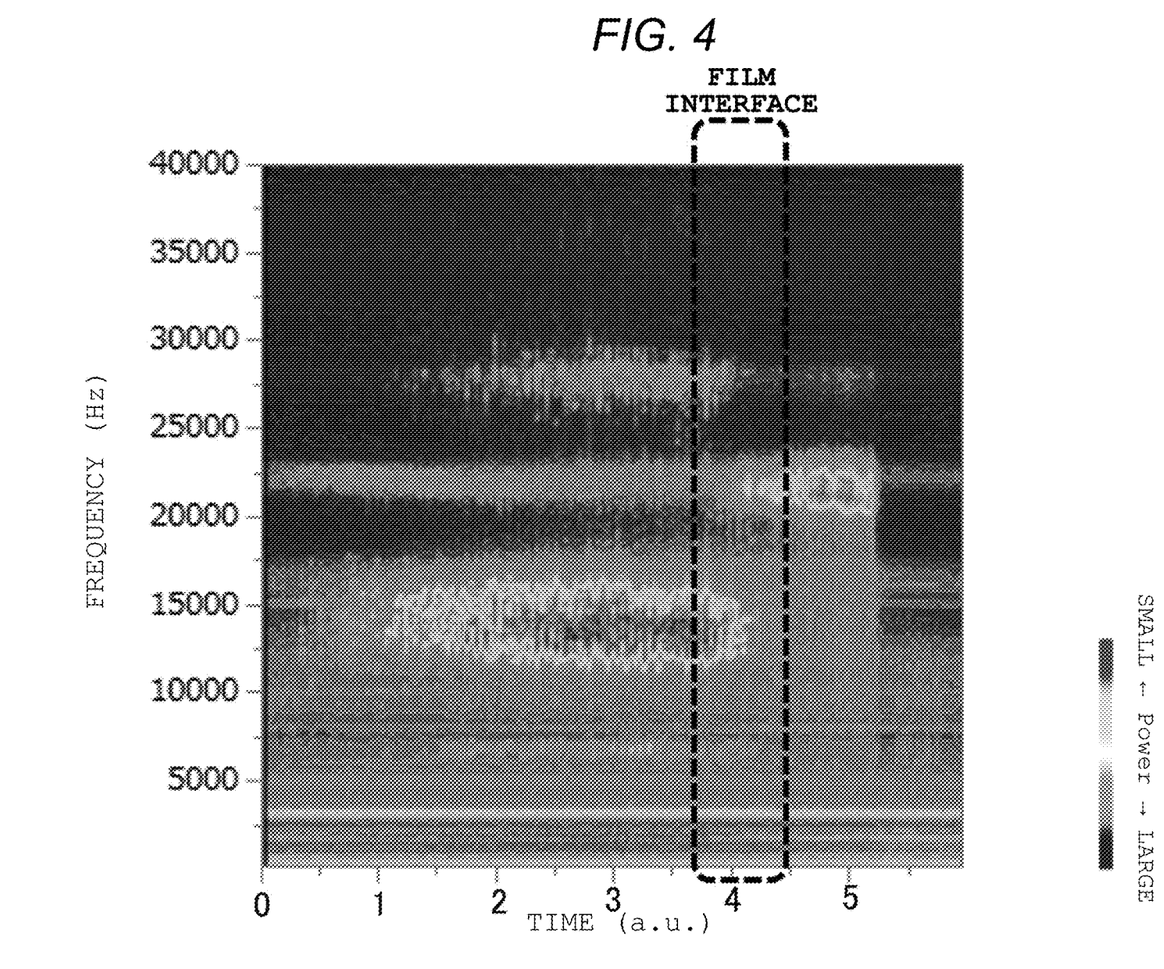
FIG. 4 shows an example of a temporal change of the sound pressure data for each frequency obtained by the semiconductor manufacturing apparatus of the first embodiment.

FIG. 4 shows an example of a temporal change of the sound pressure data for each frequency obtained by the semiconductor manufacturing apparatus 100 of at least one embodiment. The wafer W is a silicon wafer, and the film M is a tungsten film. While the tungsten film is polished, a high sound pressure is observed around 15 kHz. On the other hand, when the polishing of the tungsten film is ended and the silicon wafer is polished, a high sound pressure is observed around 22 kHz. In this way, for example, it can be determined whether or not the polishing of the tungsten film is ended. Further, FIG. 4 shows an example of controlling polishing by using a polishing amount (a second polishing amount) of a film calculated by using a sound pressure (an example of a ninth sound pressure) of a sound (an example of a ninth sound) in the frequency bandwidth of 20 kHz or higher and 100 kHz or lower, and a polishing amount (a third polishing amount) of a film calculated by using a sound pressure (an example of a tenth sound pressure) of a sound (an example of a tenth sound) in the frequency bandwidth of 10 Hz or higher and less than 20 kHz.

Next, the effects of at least one embodiment will be described.

The polishing speed of the CMP changes due to slight quality variations of the pads and slurries used. In order to control the thickness of a film, it is possible to provide a stopper film that is difficult to be polished in a film. However, when the stopper film is provided, the semiconductor manufacturing process becomes complicated. Therefore, it is desirable to polish while observing the thickness of a film by some means so that the amount of polishing becomes the target polishing amount.

As one of a method for controlling the thickness of a film, an eddy current method can be mentioned. An eddy current is generated when magnetic field lines are passed through the film formed on the wafer W. Along with this eddy current, magnetic field lines are generated in the direction opposite to the magnetic field lines that have passed through. It is possible to measure the thickness of a film by measuring the strength of the magnetic field lines generated in the opposite direction. The eddy current method is used, for example, to control the thickness of a film of a conductive film such as a metal film through which an eddy current easily flows.

Further, as another method for controlling the thickness of a film, an optical method is possible. When the film formed on the wafer W is irradiated with light, reflected light from a surface of the film and reflected light that interferes with the reflected light from an interface between the film and the wafer are observed. It is possible to measure the thickness of a film by measuring the intensity of the reflected light. The optical method is used, for example, for controlling the thickness of a film of the insulating film.

However, in a case of the eddy current method or the optical method, there is a problem that the structure of the semiconductor manufacturing apparatus becomes complicated because the measuring method differs depending on the type of film as described above. Further, when the film has a multi-layer structure, there is a problem that the measurement accuracy of the thickness of a film is lowered due to the reflected light reflected by an interface of a plurality of films in the multi-layer structure. Further, particularly in the case of the optical method, there is a problem that the measurement accuracy is lowered because the reflected light is affected by the abrasive grains or shavings contained in the slurry.

Therefore, the semiconductor manufacturing apparatus 100 of at least one embodiment includes a first top ring that is rotatable and holds a wafer, a first turntable that is rotatable and has a polishing pad for performing polishing of a film formed on the wafer, a sound measuring unit that measures a first sound generated during the polishing, and a first calculation unit that calculates a polishing amount of the film by using a first sound pressure of the first sound, a polishing amount per unit time of the polishing, and time of the polishing.

According to the semiconductor manufacturing apparatus 100 of at least one embodiment, since the polishing amount of a film is calculated by using the sound pressure of sound, the polishing amount can be calculated by a common method regardless of the type of film. Therefore, the structure of the semiconductor manufacturing apparatus is simple. Furthermore, it is possible to avoid the problem that the measurement accuracy of the thickness of a film is lowered, particularly in the case of the optical method used for controlling the thickness of a film of the insulating film.

Further, in the semiconductor manufacturing apparatus 100 of at least one embodiment, a polishing amount of the film is calculated by using the polishing amount per unit time of the polishing and the time of the polishing. Therefore, even when the sound pressure is different or the time of the polishing is different, the polishing amount of the film can be calculated with high accuracy. Furthermore, the unit polishing amount is obtained in advance for every different material to be polished and stored in the device maintenance history database 62. Thereafter, the polishing amount calculation unit 56 reads the unit polishing amount from the device maintenance history database 62, and uses the read unit polishing amount for calculating the polishing amount. As a result, even in the different material to be polished, the polishing amount of the film can be calculated with high accuracy.

Further, in the semiconductor manufacturing apparatus 100 of at least one embodiment, polishing is controlled based on the calculated polishing amount of the film and the target polishing amount. Therefore, the target polishing amount is obtained in advance for every different material to be polished and stored in the device maintenance history database 62. Further, by reading the target polishing amount from the device maintenance history database 62 and using the target polishing amount when controlling polishing, even in the different material to be polished, the film can be controlled with high accuracy. It is desirable that these series of operations are controlled by, for example, the device control signal transmission unit 58 of the control device 50. The method for controlling the operation is not limited to this and may be controlled by an operator, for example.

Further, in the semiconductor manufacturing apparatus 100 of at least one embodiment, the sound pressure of the sound generated before the start of polishing is subtracted from the sound pressure of the sound generated during the polishing to obtain a difference. As a result, it is possible to obtain the sound pressure of the sound caused by polishing with higher accuracy. In a case of an apparatus installed in a clean room in many cases, such as the semiconductor manufacturing apparatus 100 of at least one embodiment, since impurities may be generated from the soundproofing material, it is difficult to use the soundproofing material to reduce the sound generated before the start of polishing.

Therefore, examples of the sound generated before the start of polishing include a sound generated from the first top ring 2a and a sound generated from the first turntable 6a. This is because in each case, a loud sound exceeding a certain level is generated during operation, and the sound caused by polishing can be obtained with higher accuracy by taking differences.

It is desirable that the sound measuring unit 8 can measure sound in a frequency bandwidth of 20 kHz or higher and 100 kHz or lower. The frequency bandwidth of 20 kHz or higher and 100 kHz or lower is a so-called ultrasonic bandwidth. Generally, in the so-called audible range of less than 20 kHz, a loud operation sound is generated from a motor, a robotic hand, or other machines. On the other hand, in the ultrasonic bandwidth of 20 kHz or higher and 100 kHz or lower, the operation sound becomes small. Therefore, when the sound pressure is calculated by measuring the sound in the ultrasonic bandwidth of 20 kHz or higher and 100 kHz or lower, the sound generated before the start of polishing is small, and therefore the sound pressure to be subtracted is small. Therefore, it is possible to calculate the sound pressure with high accuracy and calculate the polishing amount of the film with high accuracy.

Furthermore, it is desirable that the sound measuring unit 8 can measure sound in a frequency bandwidth of 20 kHz or higher and 70 kHz or lower. This is because it is generally difficult to acquire a sound measuring unit 8 capable of measuring sound in a frequency bandwidth higher than 70 kHz.

Furthermore, it is desirable that the sound measuring unit 8 can measure sound in a frequency bandwidth of 20 kHz or higher and 50 kHz or lower. This is because, when sound in a frequency bandwidth higher than 50 kHz is used, since the difference between the sound generated during the polishing and the sound generated before the start of polishing is small and the SN ratio becomes poor, it is difficult to calculate the polishing amount with high accuracy.

Furthermore, it is desirable that the sound measuring unit 8 can measure sound in a frequency bandwidth of 10 Hz or higher and less than 20 kHz. This is because various sound in the audible range is generated during the polishing, which makes it possible to perform more complicated control of the thickness of a film by combining the sound in the audible range and the sound in the ultrasonic bandwidth.

According to the semiconductor manufacturing apparatus of at least one embodiment, it is possible to provide a semiconductor manufacturing apparatus capable of calculating the polishing amount with high accuracy.

Second Embodiment

A semiconductor manufacturing apparatus of the second embodiment is different from the semiconductor manufacturing apparatus of the first embodiment in that the apparatus further includes a third calculation unit that creates a regression model for predicting the first sound pressure, in which the first calculation unit calculates a polishing amount of a film using a first sound pressure prediction value calculated by using the regression model. Further, the semiconductor manufacturing apparatus of the second embodiment is different from the semiconductor manufacturing apparatus of the first embodiment in that the third calculation unit further calculates a correction coefficient by using the regression model and calculates a first sound pressure corrected by using the first sound pressure prediction value and the correction coefficient. The description of the content overlapping with the first embodiment is omitted.

Figure 5A:
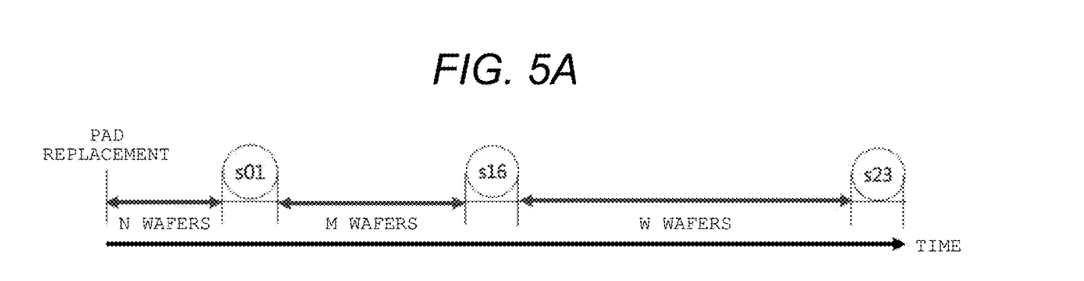
FIGS. 5A and 5B show an example of a change in sound pressure according to the number of cumulated processed wafers in the semiconductor manufacturing apparatus of a second embodiment.
Figure 5B:
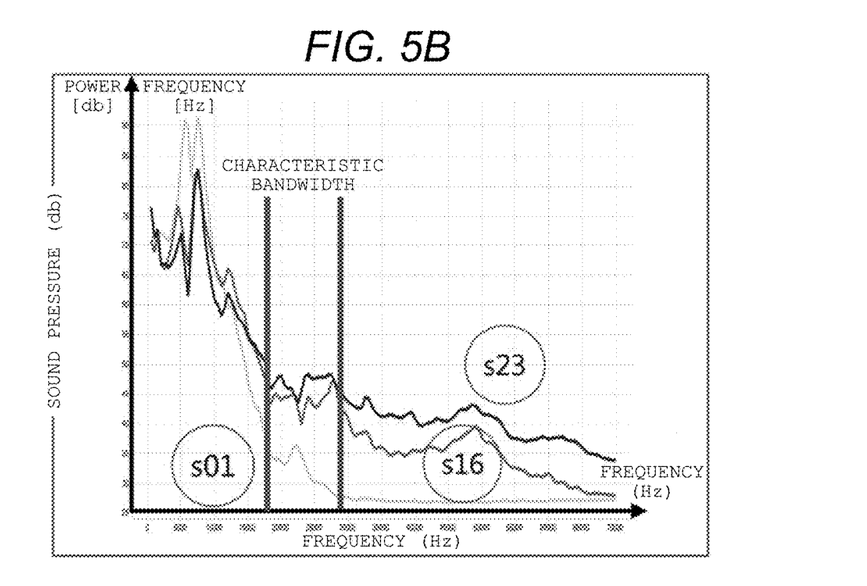

FIGS. 5A and 5B show an example of a change in sound pressure according to the number of cumulated processed wafers in the semiconductor manufacturing apparatus of at least one embodiment.

FIG. 5A shows a procedure of wafer cumulation processing in the semiconductor manufacturing apparatus of at least one embodiment. After the polishing pad is replaced, polishing processing is performed for N wafers (N is a natural number). After that, the polishing processing is performed for wafer s01. After that, the polishing processing is performed for M wafers (M is a natural number). After that, the polishing processing is performed for wafer s16. After that, the polishing processing is performed for W wafers (W is a natural number). After that, the polishing processing is performed for wafer s23.

FIG. 5B shows the frequency spectra of the sound pressures of the wafer s01, wafer s16, and wafer s23, in which the polishing processing is performed as shown in FIG. 5A. The sound pressure of s16 is larger as compared with the sound pressure of s01. Further, the sound pressure of s23 is larger as compared with the sound pressure of s16. That is, as the number of processed wafers increases, the sound pressure increases. In particular, the sound pressure in the frequency bandwidth of 18 kHz or higher and 30 kHz or lower, which is shown as the "characteristic bandwidth" in FIG. 5B, shows a remarkable increase as the number of wafers processed increases as compared with the sound pressure of less than 18 kHz. This is due to the increase in sound pressure as the deterioration of the polishing pad progresses.

Figure 6A:
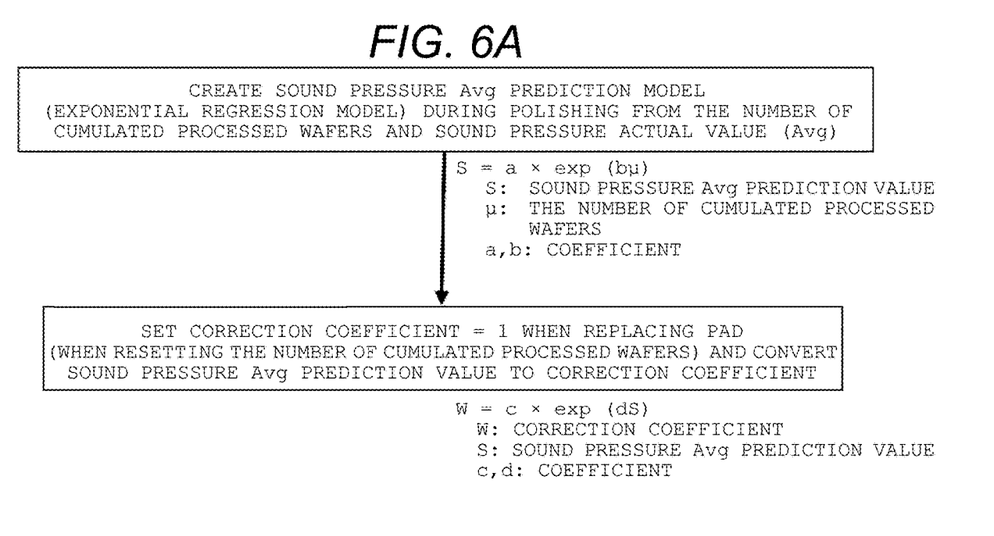
FIGS. 6A and 6B are schematic views showing a creation of a regression model for predicting a change in sound pressure and a calculation of a sound pressure prediction value in the semiconductor manufacturing apparatus of the second embodiment.
Figure 6B:
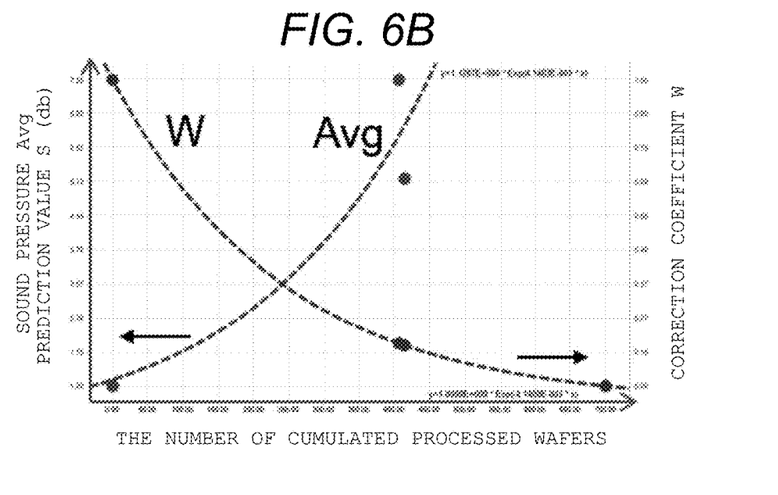

FIGS. 6A and 6B are schematic views showing a creation of the regression model for predicting the sound pressure and a calculation of the first sound pressure prediction value in the semiconductor manufacturing apparatus of at least one embodiment. FIG. 6A shows the creation of the regression model for predicting the sound pressure. The increase in the sound pressure with the increase in the number of cumulated processed wafers shown in FIGS. 5A and 5B can be well explained, for example, by the regression model described in the following expression.

$$S = a \times \exp(b\mu) \quad (3)$$

Where, S is a sound pressure Avg prediction value (an example of a first sound pressure prediction value). $\mu$ is the number of cumulated processed wafers. a and b are coefficients. The creation of the regression model is performed by the regression model creation unit 60 (FIG. 1, an example of a third calculation unit). An expression of the regression model is not limited to Expression 3.

Furthermore, the sound pressure Avg prediction value obtained by Expression (3) can be converted into a correction coefficient by the following expression.

$$W = c \times \exp(dS) \quad (4)$$

Where, W is a correction coefficient. S is the sound pressure Avg prediction value shown in Expression (3). Further, c and d are coefficients. For example, the corrected first sound pressure is calculated by the product of the correction coefficient W and the first sound pressure prediction value. By using the corrected first sound pressure, it is possible to calculate the polishing amount with high accuracy.

FIG. 6B is a view showing the sound pressure Avg prediction value and the correction coefficient with respect to the number of cumulated processed wafers. The sound pressure increases as the number of cumulated processed wafers increases. Therefore, the corrected first sound pressure can be calculated by reducing the corresponding correction coefficient as the number of cumulated processed wafers increases. The calculation of the first sound pressure prediction value, the calculation of the correction coefficient, and the calculation of the corrected first sound pressure are desirably performed by, for example, the regression model creation unit 60 (FIG. 1).

Figure 7:
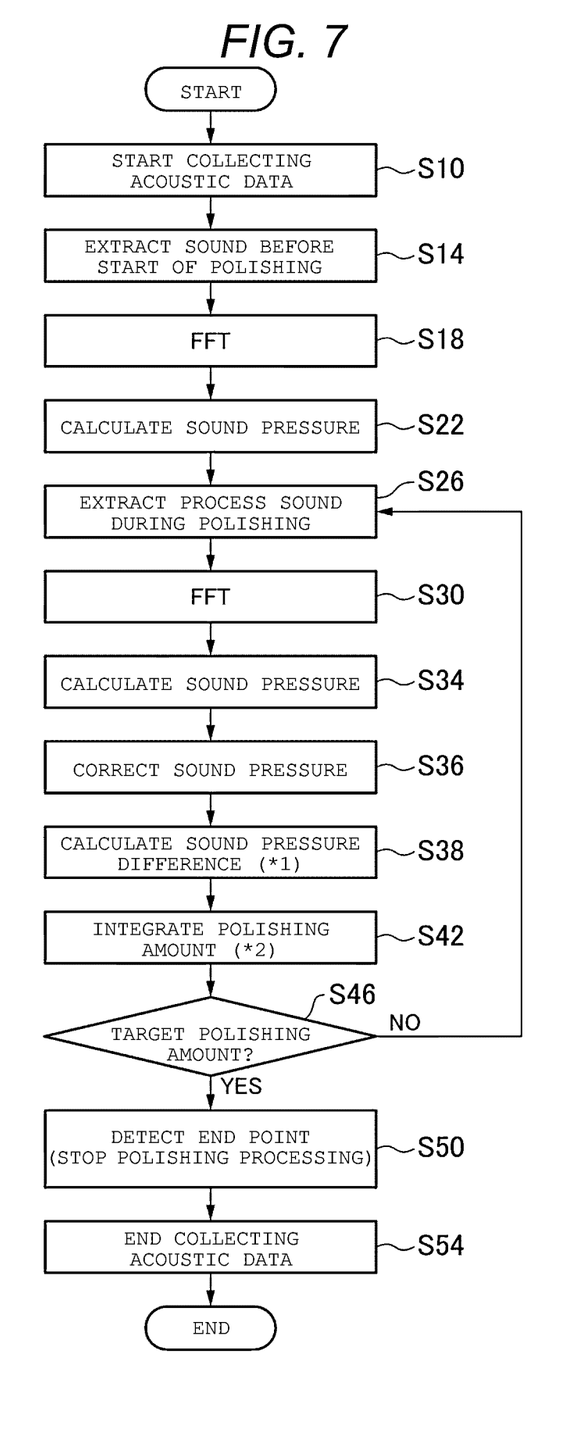
FIG. 7 is a flowchart of a method for manufacturing a semiconductor using the semiconductor manufacturing apparatus of the second embodiment.

FIG. 7 is a flowchart of a method for manufacturing a semiconductor using the semiconductor manufacturing apparatus of at least one embodiment. The second embodiment is different from the flowchart (FIG. 2) of the method for manufacturing the semiconductor of the first embodiment in that the above-mentioned processing is performed as the sound pressure correction (S36) between the sound pressure calculation (S34) and the polishing amount integration (S42).

According to the semiconductor manufacturing apparatus of at least one embodiment, it is possible to provide a semiconductor manufacturing apparatus capable of calculating the polishing amount with higher accuracy.

Third Embodiment

A semiconductor manufacturing apparatus of the third embodiment is different from the semiconductor manufacturing apparatus of the first embodiment and the semiconductor manufacturing apparatus of the second embodiment in that the apparatus further includes a rotatable second top ring and a rotatable second turntable, in which the second sound pressure further includes an eleventh sound pressure of an eleventh sound generated from the second top ring and a twelfth sound pressure of a twelfth sound generated from the second turntable. Further, the semiconductor manufacturing apparatus of the third embodiment is different from the semiconductor manufacturing apparatus of the first embodiment and the semiconductor manufacturing apparatus of the second embodiment in that the apparatus further includes a robotic hand (robot hand) that moves the wafer to the top ring and a cleaning unit that cleans the wafer, in which the second sound pressure further includes a thirteenth sound pressure of a thirteenth sound generated from the robotic hand and a fourteenth sound pressure of a fourteenth sound generated from the cleaning unit. The description of the content overlapping with the first embodiment and the second embodiment is omitted.

Figure 8:
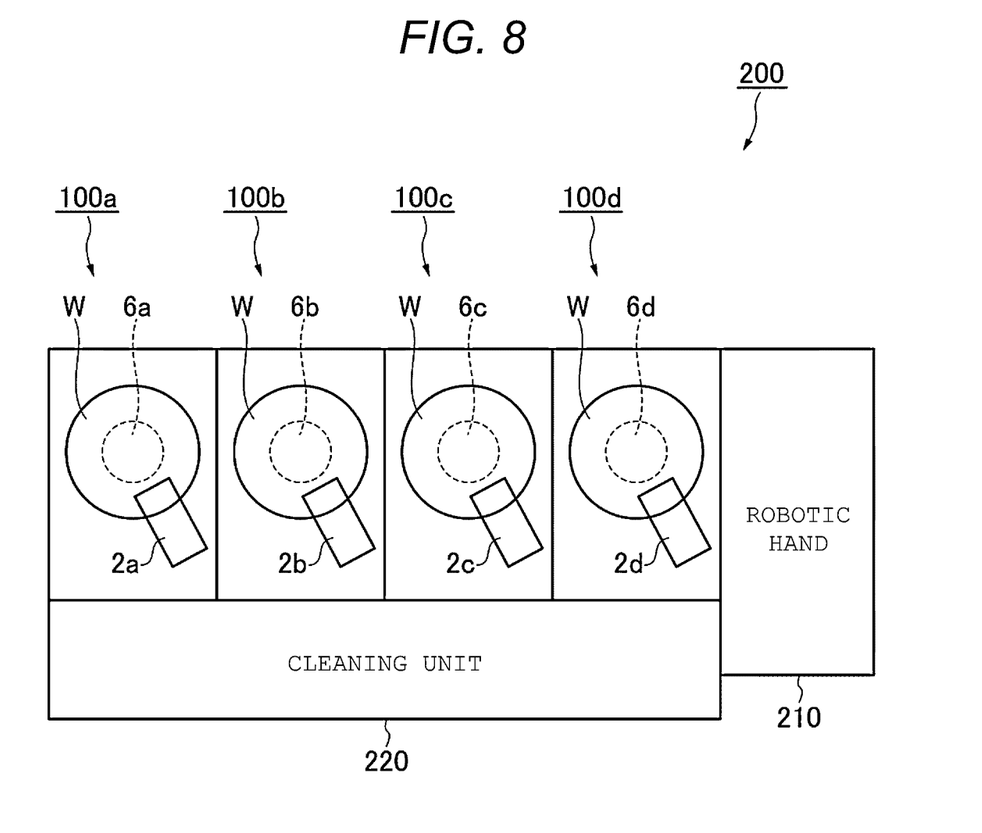
FIG. 8 is a schematic view of main portions of a semiconductor manufacturing apparatus of a third embodiment.

FIG. 8 is a schematic view of main portions of the semiconductor manufacturing apparatus 200 of at least one embodiment.

The semiconductor manufacturing apparatus includes semiconductor manufacturing apparatus 100a, 100b, 100c, and 100d corresponding to the semiconductor manufacturing apparatus 100 of the first embodiment. Further, the semiconductor manufacturing apparatus 200 further includes a robotic hand 210 for moving the wafers W to the top rings of the semiconductor manufacturing apparatus 100a, 100b, 100c and 100d, and a cleaning unit 220 (cleaner) for cleaning the wafers W. Regarding the semiconductor manufacturing apparatus 100a, the wafer W, the first top ring 2a, and the first turntable 6a are shown from the configuration shown in FIG. 1. The same applies to the semiconductor manufacturing apparatus 100b, the semiconductor manufacturing apparatus 100c, and the semiconductor manufacturing apparatus 100d.

In the semiconductor manufacturing apparatus 200 of the present embodiment, a sound pressure (an example of an eleventh sound pressure) of a sound (an example of an eleventh sound) generated from the second top ring 2b in the semiconductor manufacturing apparatus 100b, and a sound pressure (an example of a twelfth sound pressure) of a sound (an example of a twelfth sound) generated from the second turntable 6b are collected as a sound before the start of polishing. As the sound before the start of polishing, a sound generated from the third top ring 2c, a sound generated from the third turntable 6c, a sound generated from the fourth top ring 2d, a sound generated from the fourth turntable 6d, an operation sound generated from the robotic hand 210 (an example of a thirteenth sound), and an operation sound generated from the cleaning unit (an example of a fourteenth sound) can be further included. In this way, it is possible to provide a semiconductor manufacturing apparatus capable of calculating the polishing amount with higher accuracy.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A semiconductor manufacturing apparatus comprising:
a rotatable first top ring configured to hold a wafer having a film;
a rotatable first turntable having a polishing pad arranged to perform polishing of the film;
a sound sensor configured to measure a first sound generated during the polishing; and
a controller configured to calculate a polishing amount of the film based on (i) a first sound pressure of the first sound, (ii) a polishing amount per unit time of the polishing, and (iii) an elapsed time of the polishing, wherein a prediction value of the polishing amount is determined based on the first sound pressure during polishing, a second sound pressure before polishing, and the polishing amount per unit time according to Equation (2), $$\text{Prediction value of polishing amount} = \sum_{t=1}^{n}\left(\int_{f1}^{f2}(\text{Sound pressure during polishing} - \text{Sound pressure before polishing}) \times \text{Polishing amount per unit time}\right) \quad (2)$$

2. The semiconductor manufacturing apparatus according to claim 1,
wherein the polishing amount per unit time is predetermined for a plurality of materials to be polished.

3. The semiconductor manufacturing apparatus according to claim 1, further comprising:
a first memory that stores the polishing amount per unit time.

4. The semiconductor manufacturing apparatus according to claim 1, wherein the controller is configured to control the polishing based on the polishing amount of the film and a target polishing amount.

5. The semiconductor manufacturing apparatus according to claim 4,
wherein the target polishing amount is predetermined for a plurality of materials to be polished.

6. The semiconductor manufacturing apparatus according to claim 4, further comprising:
a second memory that stores the target polishing amount.

7. The semiconductor manufacturing apparatus according to claim 1, wherein the controller is configured to calculate the first sound pressure of the first sound.

8. The semiconductor manufacturing apparatus according to claim 1,
wherein the controller is configured to
provide a regression model for predicting the first sound pressure,
calculate a first sound prediction value using the regression model, and
calculate the polishing amount of the film based on the first sound pressure prediction value.

9. The semiconductor manufacturing apparatus according to claim 8,
wherein the controller is further configured to:
calculate a correction coefficient based on the regression model, and
calculate the first sound pressure prediction value based on the first sound pressure and the correction coefficient.

10. The semiconductor manufacturing apparatus according to claim 1,
wherein the second sound pressure includes a third sound pressure of a third sound generated from the first top ring and a fourth sound pressure of a fourth sound generated from the first turntable.

11. The semiconductor manufacturing apparatus according to claim 1,
wherein the controller is configured to calculate the polishing amount of the film by using a fifth sound pressure which is a difference between the first sound pressure and the second sound pressure.

12. The semiconductor manufacturing apparatus according to claim 1,
wherein the sound sensor is configured to measure a sixth sound falling within a frequency bandwidth of 20 kHz or higher and 100 kHz or lower.

13. The semiconductor manufacturing apparatus according to claim 12,
wherein the sound sensor is configured to measure a seventh sound falling within a frequency bandwidth of 20 kHz or higher and 70 kHz or lower.

14. The semiconductor manufacturing apparatus according to claim 13,
wherein the sound sensor is configured to measure an eighth sound falling within a frequency bandwidth of 20 kHz or higher and 50 kHz or lower.

15. The semiconductor manufacturing apparatus according to claim 12,
wherein the sound sensor is configured to measure a ninth sound falling within a frequency bandwidth of 20 kHz or higher and 100 kHz or lower and a tenth sound falling within a frequency bandwidth of 10 Hz or higher and less than 20 kHz, and
the controller is configured to control the polishing based on a second polishing amount of the film calculated based on a ninth sound pressure of the ninth sound, and a third polishing amount of the film calculated based on a tenth sound pressure of the tenth sound.

16. The semiconductor manufacturing apparatus according to claim 1, further comprising:
a second rotatable top ring; and
a second rotatable turntable,
wherein the second sound pressure further includes an eleventh sound pressure of an eleventh sound generated from the second top ring and a twelfth sound pressure of a twelfth sound generated from the second turntable.

17. The semiconductor manufacturing apparatus according to claim 1, further comprising:
a robotic hand configured to move the wafer to the first top ring; and
a cleaner configured to clean the wafer, wherein the second sound pressure further includes a thirteenth sound pressure of a thirteenth sound generated from the robotic hand and a fourteenth sound pressure of a fourteenth sound generated from the cleaner.

18. The semiconductor manufacturing apparatus according to claim 1, further comprising:
   a robotic hand configured to move the wafer to the first top ring; and
   a cleaner configured to clean the wafer.

* * * * *